(12) United States Patent
Ferrer et al.

(10) Patent No.: US 7,385,403 B2
(45) Date of Patent: Jun. 10, 2008

(54) KVM SWITCH CONFIGURED TO ESTIMATE A LENGTH OF A CONDUCTOR

(75) Inventors: Vincent J. Ferrer, Macedon, NY (US); Jack E. Priebe, Palmyra, NY (US); Randy J. King, Rochester, NY (US)

(73) Assignee: Belkin International, Inc., Compton, CA (US)

( * ) Notice: Subject to any disclaimer, the term of this patent is extended or adjusted under 35 U.S.C. 154(b) by 414 days.

(21) Appl. No.: 11/043,861

(22) Filed: Jan. 25, 2005

(65) Prior Publication Data
US 2006/0167642 A1 Jul. 27, 2006

(51) Int. Cl.
*G01R 31/08* (2006.01)
*G01R 29/02* (2006.01)

(52) U.S. Cl. ............. 324/532; 324/617; 439/108; 702/79

(58) Field of Classification Search ........... 324/532, 324/616, 617
See application file for complete search history.

(56) References Cited

U.S. PATENT DOCUMENTS

| | | | |
|---|---|---|---|
| 4,970,466 A | 11/1990 | Bolles et al. | |
| 5,382,910 A * | 1/1995 | Walsh | 324/533 |
| 6,618,774 B1 | 9/2003 | Dickens et al. | |
| 6,646,454 B2 | 11/2003 | Watkins | |
| 6,771,076 B1 | 8/2004 | Smith | |
| 2003/0218578 A1 | 11/2003 | Ahern et al. | |
| 2005/0227517 A1 * | 10/2005 | Chen | 439/108 |

OTHER PUBLICATIONS

Internet: Avocent Enterprise KVM Switches and KVM Over IP solutions—AMX5000 KVM Switch, [http://www.avocent.com/web/en.nsf/Content/AMX5000]; retrieved from the internet on Jan. 25, 2005.

* cited by examiner

*Primary Examiner*—Vincent Q Nguyen
(74) *Attorney, Agent, or Firm*—Bryan Cave LLP

(57) ABSTRACT

A system for estimating a length of a conductor (110) having a first end (111) and a second end (112) includes a device (120) capable of placing an electric signal on the conductor, an impedance element (130) that maintains the electric signal within a predetermined voltage range, and a timer (140). The device places the electric signal on the conductor such that the electric signal travels along the conductor from the first end to the second end and back to the first end. The timer determines a time required for the electric signal to travel along the conductor from the first end to the second end and back to the first end. The length of the conductor may be estimated based on the time. A compensation factor may be determined based on the length or the time, and may be used to compensate for signal attenuation in the conductor.

27 Claims, 2 Drawing Sheets

| 310 | Generate an electric signal such that the electric signal travels along the first conductor from the first end to the second end and back to the first end |

↓

| 320 | Cause the electric signal to pass through an impedance element electrically coupled to the first conductor such that the impedance element maintains the electric signal within a predetermined voltage range |

↓

| 330 | Determine a first time value required for the electric signal to travel along the first conductor from the first end to the second end and back to the first end |

↓

| 340 | Determine, based on the first time value, a compensation factor that will compensate for the signal attenuation |

↓

| 350 | Create a database comprising a first plurality of compensation factors, including the compensation factor |

↓

| 360 | Determine a second plurality of compensation factors by extrapolating from the first plurality of compensation factors |

↓

| 370 | Associate each one of the second plurality of compensation factors with a corresponding one of a second plurality of conductors |

KVM SWITCH CONFIGURED TO ESTIMATE A LENGTH OF A CONDUCTOR

FIELD OF THE INVENTION

This invention relates generally to electrical signal transmission in electronic systems, and relates more particularly to compensation for signal attenuation in electronic systems.

BACKGROUND OF THE INVENTION

Electronic systems, such as computer systems, rely for proper operation on the transmission of electric signals among the various components of the system. In a computer system, for example, electric signals must be transmitted between the computer and a keyboard, a video monitor, a mouse, and any other peripheral electronic devices coupled to the computer. The phrase "peripheral device" will be used herein to mean any electronic device coupled to a computer or forming a part of any electronic system, including a keyboard, a video monitor, and a mouse.

Under certain circumstances it may be desirable to place the computer in one location and to place the peripheral devices in another location separated from the computer's location by a certain distance. Category 5 (CAT5) cable or similar cable is often used for the purpose of carrying electric signals between the computer and the peripheral devices. It is well known that an electric signal becomes attenuated as it travels along a cable, and that the degree of attenuation is directly proportional to the length of the cable. Such attenuation can be compensated for by appropriately boosting or otherwise filtering the electric signal in order to return it to its original characteristics. The amount of compensation required in order to properly filter an electric signal will be referred to herein as a "compensation factor." The term "filter signal" will be used herein to refer to the supplemental electric signal that, when added to the electric signal, compensates for any attenuation and restores the electric signal to its original characteristics. The filter signal for a particular electric signal is generated by a device or a circuit that has been configured by taking into account the compensation factor.

A reason for wanting to compensate for attenuated electrical signals becomes apparent when an analog, high-resolution video signal, for example, is transmitted along a long series of conductors. As cable length increases, the video signal becomes increasingly distorted and blurry, leading to user fatigue and loss of usefulness of the video signal.

One of ordinary skill in the art will recognize that a well known method for measuring the length of a conductor is to use various forms of a Time Domain Reflectometer, or TDR. A TDR is capable of taking extremely high accuracy measurements, but the expense and manual intervention required are prohibitive where an inexpensive and automatic method can be used. An automatic compensation system is desirable because it requires less user intervention than a manual compensation system. However, while they function well, the existing automatic compensation systems are expensive and complicated. Accordingly, there exists a need for a simple and inexpensive system and method capable of automatically determining a compensation factor and/or a filter signal needed to compensate for an attenuated electric signal in an electronic system.

BRIEF DESCRIPTION OF THE DRAWINGS

The invention will be better understood from a reading of the following detailed description, taken in conjunction with the accompanying figures in the drawings in which:

FIG. 3 is a flow chart illustrating a method for determining a compensation factor suitable for correcting an attenuated signal in a conductor according to an embodiment of the invention.

Figure 1:
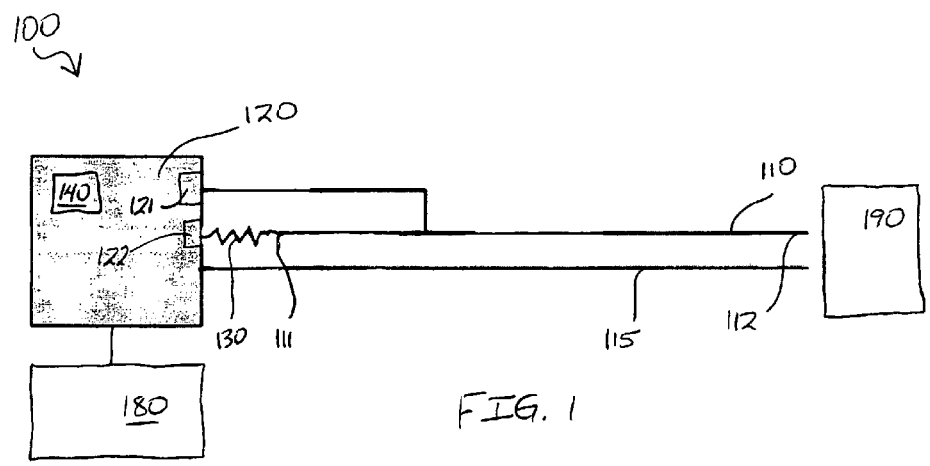
FIG. 1 is a block diagram showing a system for estimating a length of a conductor according to an embodiment of the invention.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical, mechanical, or other manner.

DETAILED DESCRIPTION OF THE DRAWINGS

In one embodiment of the invention, a system for estimating a length of a conductor having a first end and a second end comprises a device capable of placing an electric signal on the conductor, an impedance element, such as a resistor or an inductor, electrically coupled to the conductor, and a timer. (The impedance element may at times be referred to herein as a resistor, a resistive element, an inductor, or an inductive element. All such terms should be thought of as interchangeable herein, except where the context indicates otherwise.) The device places the electric signal on the conductor at the first end such that the electric signal travels along the conductor from the first end to the second end and back to the first end. The impedance element maintains certain transitions of the electric signal within a predetermined voltage range, as further explained below. The timer determines a time required for the electric signal to travel along the conductor from the first end to the second end and back to the first end. The length of the conductor may be determined based on the time. A compensation factor may be determined based on the length or the time, and the compensation factor may be used, if needed, to compensate for or correct a signal attenuation in the conductor.

Referring now to the figures, FIG. 1 is a block diagram showing a system 100 for estimating a length of a conductor 110 according to an embodiment of the invention. The word "estimating" is used herein so as to make it clear that the length measurements obtained using system 100 may only be accurate to within a certain margin of error. In one embodiment, for example, system 100 may only be able to estimate the length of conductor 100 to within fifty feet. However, a length estimate having the stated level of accuracy is often sufficient.

As illustrated in FIG. 1, system 100 comprises a conductor 110, a device 120 capable of placing an electric signal on conductor 110, an impedance element 130, and a timer 140, each of which will be further described below.

Conductor 110 comprises an end 111 and an end 112 opposite end 111. Conductor 110, in the illustrated embodiment, is one of a pair of wires forming what is known as an unshielded twisted pair (UTP). A conductor 115 in FIG. 1 is the other wire of the pair. In at least one embodiment, conductor 115 is grounded.

As illustrated in FIG. 1, end 112 of conductor 110 is unterminated, or electrically floating. In another embodiment, end 112 may be electrically coupled, as will be further explained below. Device 120 generates the electric signal at the first end of conductor 110 such that the electric signal travels or propagates along conductor 110 from end 111 to end 112 and back to end 111. In the illustrated embodiment, device 120 comprises a microprocessor, such as a Silicon Labs C8051F320, having an input port 121, which has a threshold voltage referred to herein as an input threshold voltage, and an output port 122. In a non-illustrated embodiment, device 120 instead comprises an arrangement of timers, counters, and/or other electrical or mechanical components capable of generating an electric signal on conductor 110 and measuring the time delay, i.e., the time required for the electric signal to travel along the conductor from end 111 to end 112 and back to end 111, in the manner described above. However, notwithstanding the available alternatives, device 120 will be referred to hereinafter as microprocessor 120.

As an example, system 100 may be used in conjunction with a KVM system in which a KVM switch 190 communicates with a plurality of computers, including a computer 180. In that embodiment, KVM switch 190 contains a microprocessor, referred to herein as a KVM microprocessor, which controls the communication with the plurality of computers. In a typical KVM system, such communication takes place over CAT5 or similar cable, including cable known in the art as CAT5e and CAT6. The term "CAT5," or "CAT5 cable," will be used herein to refer to all types of UTP cable, including, but not limited to, CAT5, CAT5e, and CAT6.

Referring still to the typical KVM system, a plurality of CAT5 cables extend between the KVM switch and a plurality of computers or peripheral devices, each of which computers or peripheral devices contain or are connected to their own microprocessors. Often these microprocessors, referred to herein as host microprocessors, are contained within a dongle plugged into or otherwise connected to the computer or peripheral device. Microprocessor 120 in FIG. 1 is an example of such a host microprocessor. The host microprocessors are responsible for communicating with the KVM microprocessor, and also for emulating keyboard, video, and/or mouse signaling to the computer or peripheral devices to which they are connected. In an embodiment where the cables extend between the KVM switch and the peripheral devices, the KVM system is often referred to as a console extender.

Microprocessor 120 exists in the typical KVM system, in order to perform the described functions, whether or not the KVM system is equipped with system 100. Accordingly, system 100 may be added to a typical KVM system very easily and inexpensively. All that need be added to the typical KVM system is resistor 130, the cost of which is negligible.

From the preceding discussion it can be seen that a typical KVM system comprises what may be thought of as a hub and spoke configuration, with a KVM switch containing a KVM microprocessor at the hub and a plurality of CAT5 cables radiating from the KVM switch and forming the spokes. Thus, at one end of each cable is the KVM switch, and at the other end of each cable is a computer and a host microprocessor. FIG. 1 depicts the KVM switch (KVM switch 190) and one of these spokes (formed at least in part by conductors 110 and 115) with its associated computer (computer 180) and host microprocessor (microprocessor 120).

In one embodiment, there is a single communication path into and out of the KVM microprocessor. This single communication path is switched onto each of the plurality of CAT5 cables one at a time, and the KVM microprocessor controls the timing and duration of a communication session with each host microprocessor. In another embodiment there exist a plurality of active communication paths into and out of the KVM microprocessor, but the number of the plurality of active communication paths is less than the number of CAT5 cables present in the embodiment. In either embodiment, for the period of time during which the KVM microprocessor is communicating with a particular host microprocessor over a particular CAT5 cable, each of the other CAT5 cables in the KVM system are unterminated at the KVM microprocessor, i.e., do not form a currently active communication path, thus allowing a window of time in which to generate the electric signal, place it on one of the unterminated CAT5 cables, and measure the electric signal's travel time along that cable, as described above. This measurement of travel time must be completed before the KVM microprocessor next attempts to communicate across that cable.

In one embodiment, it is the host microprocessor that generates the electric signal and places it on the cable. In a different embodiment, the KVM microprocessor, or one or more other electrical or mechanical components of KVM switch 190, performs those tasks. The former embodiment takes advantage of the window of time, described above, during which the cable is unterminated at the KVM switch end. The latter embodiment does not use that window of time, but must interrupt the KVM microprocessor's other tasks in order to allow the KVM microprocessor an opportunity to generate the electric signal and place it on the cable. In either or both of the foregoing embodiments, or in a different embodiment, the microprocessor, whether the host microprocessor or the KVM microprocessor, may also measure the travel time of the electric signal, using an internal timer, for example, and/or store the results. Alternatively, the generating, measuring, and/or storing functions may be performed by components other than the microprocessors.

After a cable has been evaluated as described, the measurement need not be repeated until the possibility exists that the cable may have changed such that the results of the evaluation previously performed are no longer valid. Thus, for example, such evaluation may be repeated each time the evaluated cable is replaced with a different cable, each time the KVM system or the computer is powered on or reset, or whenever a similar event occurs.

Impedance element 130 is electrically coupled to conductor 110, and maintains the electric signal within a predetermined voltage range chosen so as to ensure a proper measurement of the electric signal's travel time. As an example, the predetermined voltage range can have a relationship to an input voltage of input port 121 calculated to trigger timer 140 on or off at only the appropriate times, as will be further explained below in connection with FIG. 2. In one embodiment, impedance element 130 is electrically coupled in series between end 111 of conductor 110 and microprocessor 120. In a particular manifestation of this embodiment, the coupling to microprocessor 120 is to input port 121. In the same or another embodiment, impedance element 130 comprises a resistor connected between output port 122 and input port 121.

Timer 140, in the illustrated embodiment, forms a part of microprocessor 120. In a variation of the illustrated embodiment, timer 140 is a part of, or is connected to, input port 121. In another embodiment, timer 140 can be separate from microprocessor 120. In yet another embodiment, timer 140 and microprocessor 120 can both form a part of or be contained within a larger apparatus, such as a dongle. In any case, timer 140 is capable of determining a time required for the electric signal to travel or propagate along conductor 110 from end 111 to end 112 and back to end 111. When the time required for such travel is known, other parameters relative to conductor 110 and system 100 may be determined. As further explained below, such parameters may include the length of conductor 110 and/or the compensation factor necessary to compensate for attenuation or signal degradation in conductor 110. Accordingly, system 100 may properly be thought of as a system for determining a compensation factor suitable for correcting an attenuated signal in a conductor, in addition to being thought of a system for estimating a length of a conductor.

Figure 2:
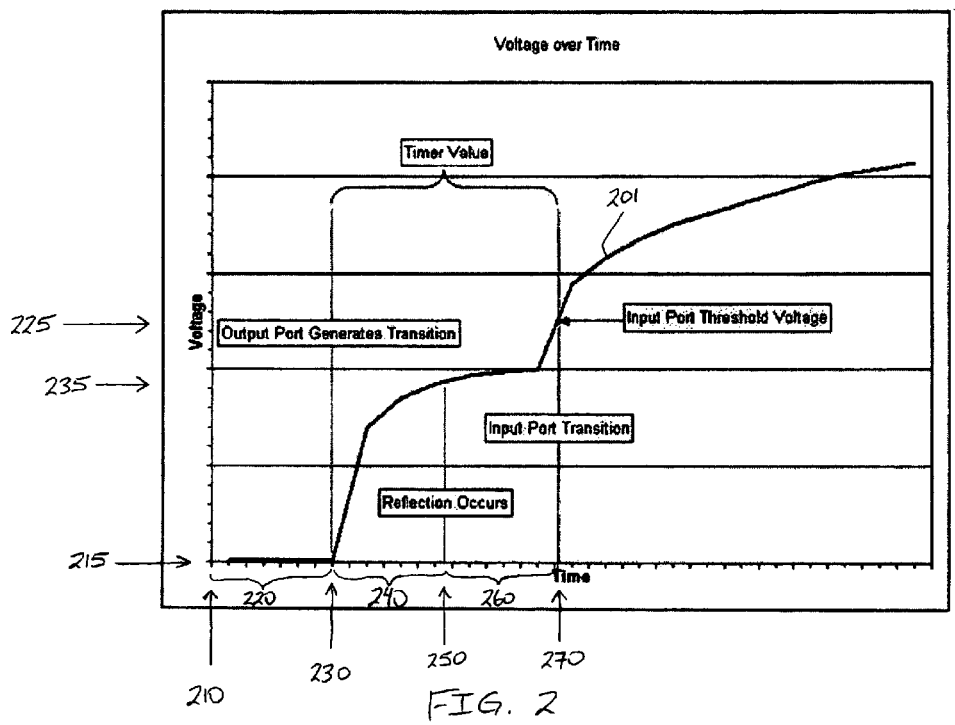
FIG. 2 is a graph depicting a relationship between voltage and time within the system of FIG. 1 according to an embodiment of the invention.

FIG. 2 is a graph depicting a relationship between voltage and time at input port 121 (FIG. 1) of microprocessor 120 (FIG. 1) according to an embodiment of the invention. Input port 121 has an input threshold voltage 225. A function 201 indicates the voltage seen by input port 121 at any particular time that lies within the scope of the graph. Referring now to FIGS. 1 and 2, timer 140 begins counting at a time 210, at which time input port 121 experiences an initial voltage 215. A wide range of values for initial voltage 215 are possible; two common choices are zero volts and five volts. During a time period 220, following time 210, the voltage at input port 121 remains at or near initial voltage 215.

At a time 230, output port 122 of microprocessor 120 generates an electric signal at end 111 of conductor 110. This electric signal shows up in FIG. 2 as the abrupt change in direction of function 201 at time 230. Following its generation, the electric signal propagates along conductor 110 from end 111 to end 112, passing through impedance element 130 on the way. Input port 121 does not immediately read this electric signal because the voltage drop across impedance element 130 and the impedance of conductor 110 are such that the electric signal is kept below input threshold voltage 225 during the electric signal's initial traversal of conductor 110.

At a time 250, the electric signal reflects off of end 112 of conductor 110 and begins traveling back toward end 111. At time 250 the electric signal has a first interim voltage 235. The propagation of the electric signal between end 112 and end 111 takes place during a time period 260. In the embodiment of FIG. 1, where conductor 110 is unterminated at end 112, the voltage of the electric signal doubles in amplitude when the electric signal is reflected at end 112. This fact, together with the resistance of impedance element 130, creates a situation in which the electric signal, upon its return to end 111, has a second interim voltage substantially equal to threshold voltage 225. Accordingly, when the electric signal first returns to end 111 after having traveled once to end 112, the voltage at input port 121 crosses input threshold voltage 225, thus stopping timer 140 at a time 270. The comment, first made above, that the impedance element maintains certain transitions of the electric signal within a predetermined voltage range refers, at least in part, to the transition and the situation just described.

As stated above, impedance element 130 can comprise a resistor. In that instance, the resistance of impedance element 130 is chosen such that the voltage at input port 121 crosses input threshold voltage 225 during the time frame just described, i.e., when the electric signal returns to end 111 after having traveled once to end 112. Said another way, the resistance is chosen such that the first interim voltage is less than the input threshold voltage, and the second interim voltage is substantially equal to or greater than the input threshold voltage. Because the voltage rise in the electric signal is more abrupt at the center, the electric signal may be centered on input threshold voltage 225 so as to minimize the impact of voltage shifts caused by component and device tolerances.

The choice of the resistance value is made based on at least one of: an output impedance of output port 122; an impedance of conductor 110; and input threshold voltage 225. A typical resistance chosen for impedance element 130 might be one hundred eighty Ohms. However, the resistance will, of course, vary based on values of the parameters mentioned above. One of ordinary skill in the art will be able to directly calculate or empirically determine the best value for impedance element 130 to best center the electric signal at input threshold voltage 225.

The electric signal depicted in FIG. 2 is a positive going electric signal, where input threshold voltage 225 exceeds initial voltage 215, and the voltage at input port 121 rises from an initial low voltage, less than input threshold voltage 225, to progressively higher voltages, greater than input threshold voltage 225, at later times. In an embodiment with the positive going electric signal, the timer is stopped when the voltage at input port 121 first equals or exceeds input threshold voltage 225. In another embodiment, system 100 employs a negative going electric signal in which the initial voltage exceeds input threshold voltage 225, and where the voltage at input port 121 drops from an initial high voltage to progressively lower voltages at later times. In an embodiment with the negative going electric signal, the timer is stopped when the voltage at input port 121 first drops below input threshold voltage 225. The phrase "crosses input threshold voltage 225" in the preceding paragraph should be understood to encompass both embodiments.

In the embodiment just described, end 112 of conductor 110 was unterminated. It was mentioned above that in another embodiment end 112 is electrically coupled. In one (non-illustrated) manifestation of that other embodiment, end 112 is electrically coupled to a ground potential. As an example of an operation under this non-illustrated manifestation, microprocessor 120 generates a positive going electric signal that would rise to a specific voltage level and travel along conductor 110 from end 111 to end 112 through impedance element 130. When the electric signal reached end 112 its voltage would go to zero because of the ground connection, and this zero voltage would reflect back to end 111. Timer 140 would measure the time from when the electric signal rose to the specific voltage level to the time when the electric signal dropped to the zero voltage level as a way of measuring the time required for the electric signal to travel from end 111 to end 112 and back to end 111. Once the tine is known, the length of and/or the appropriate compensation factor for conductor 110 may be determined in the manner described above.

From the foregoing discussion it may be seen that the reading on timer 140 at time 270 is the sum of: (a) time period 220; and (b) time periods 240 and 260—the time necessary for the electric signal to propagate from end 111 to end 112 and back to end 111. Thus, in order to obtain the true travel time for the electric signal, time period 220 is subtracted from the reading on timer 140 displayed at time 270. It should be understood that in at least one embodiment, time period 220 is equal to zero, such that the electric signal is generated at the same time that timer 140 begins to count.

Knowing the travel time may be useful for a number of reasons. As an example, the travel time may be used to directly estimate the length of conductor 110, using well known formulae that relate distance traveled to the time required to traverse that distance. As another example, the travel time may be used to determine a compensation factor suitable for compensating for attenuation or signal degradation in conductor 110. As the determination of such a compensation factor is a particular use contemplated for system 100, that determination process will now be described in greater detail.

Consider an electric signal generated at one end of a CAT5 cable and transmitted to the other end of the cable where it is evaluated. If the cable is long enough, the signal is degraded during the traversal of the cable. As an example of such signal degradation, the signal may become attenuated such that high frequency transitions that should be sharp are instead rounded. The degree of attenuation experienced by a signal traveling along a CAT5 or other cable is predictable for a given cable length. Such attenuation can be compensated for by boosting certain signal frequencies using an appropriate filter signal.

In one embodiment, the compensation factor for a particular cable—assume it is conductor 110—is determined by conducting an empirical test in which various possible compensation factors are applied in turn to conductor 110 until an appropriate compensation factor is identified.

If the length of conductor 110 is known then that appropriate compensation factor may be associated not just with conductor 110, but also with all other cables having the same or similar lengths. This process may be repeated for a variety of cable lengths, and a database or lookup table may then be created in which each one of a plurality of cable lengths is matched to an appropriate compensation factor. Because there is a linear relationship between cable length and compensation factor, creating such a database can be as simple as empirically determining the appropriate compensation factor for two or three cable lengths and then extrapolating to obtain additional compensation factors for additional cable lengths, all of which additional compensation factors will lie along the same line.

The database may even be taken a step further, to the point where each one of the plurality of compensation factors is matched not only to the corresponding one of the plurality of cable lengths but also, or instead, to the one of the plurality of travel times that corresponds to those cable lengths. Such a database would enable a user of system 100 to bypass the step of estimating length and determine the appropriate compensation factor based on travel time alone.

If desired, a database of the type described in the preceding paragraph may be loaded into a memory of microprocessor 120, at which point no further empirical testing would be necessary. Instead, because the work of matching compensation factor to cable length and/or travel time would have already been done, the only necessary task would be to estimate or determine, using the system described above, the length or travel time pertaining to the particular cable under consideration.

FIG. 3 is a flow chart illustrating a method 300 for determining a compensation factor suitable for correcting an attenuated signal in at least a first conductor having a first end and a second end, according to an embodiment of the invention. A step 310 of method 300 is to generate an electric signal such that the electric signal travels along the first conductor from the first end to the second end and back to the first end. As an example, the first conductor, the first end, and the second end can be similar to, respectively, conductor 110, end 111, and end 112, all of which are shown in FIG. 1. In one embodiment, step 310 comprises using a microprocessor to generate an electric signal on the first conductor. As an example, the microprocessor can be similar to microprocessor 120, shown in FIG. 1.

A step 320 of method 300 is to cause the electric signal to pass through an impedance element electrically coupled to the first conductor such that the impedance element maintains the electric signal within a predetermined voltage range. As an example, the impedance element can be similar to impedance element 130, shown in FIG. 1. In one embodiment, step 320 comprises electrically coupling the impedance element between the microprocessor and the first end of the first conductor, in which case step 320 would be performed before step 310.

A step 330 of method 300 is to determine a first time value required for the electric signal to travel along the first conductor from the first end to the second end and back to the first end.

A step 340 of method 300 is to determine, based on the first time value, a compensation factor that will compensate for the signal attenuation. In one embodiment, step 340 comprises estimating a length of the first conductor using a formula relating length and time, and determining the compensation factor based on the length. In another embodiment, step 340 comprises determining the compensation factor empirically without necessarily relying on a length estimation. In the same or another embodiment, a formula may be used in order to determine the compensation factor directly from the time. In the same or another embodiment, step 340 comprises accessing a database containing the compensation factor. In this embodiment, method 300 may comprise a step 350 of creating the database such that the database may be accessed as part of step 340 or another step.

A step 350 of method 300 is to create a database comprising a first plurality of compensation factors, including the compensation factor. In one embodiment, step 350 can be performed before, or as part of, step 340. As an example, step 350 can comprise sub-steps 351 through 354. Sub-step 351 comprises, for each one of a plurality of conductors, repeating steps 310, 320, and 330. Sub-step 352 comprises estimating a plurality of lengths corresponding to the plurality of conductors using a formula relating length and time. Sub-step 353 comprises determining the first plurality of compensation factors based on the plurality of lengths. Sub-step 354 comprises associating each one of the first plurality of compensation factors with a corresponding one of the plurality of conductors. In one embodiment, sub-step 352 can be replaced with a sub-step 355, which sub-step 355 comprises empirically determining a first plurality of compensation factors corresponding to the plurality of conductors.

A step 360 of method 300 is to determine a second plurality of compensation factors by extrapolating from the first plurality of compensation factors, and a step 370 of method 300 is to associate each one of the second plurality of compensation factors with a corresponding one of a second plurality of conductors.

Although the invention has been described with reference to specific embodiments, it will be understood by those skilled in the art that various changes may be made without departing from the spirit or scope of the invention. Various examples of such changes have been given in the foregoing description. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the system discussed herein may be implemented in a variety of embodiments, and that the foregoing discussion of certain of these embodiments does not necessarily represent a complete description of all possible embodiments.

All elements claimed in any particular claim are essential to the invention claimed in that particular claim. Consequently, replacement of one or more claimed elements constitutes reconstruction and not repair. Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A KVM apparatus for transferring information between a computer and a peripheral device, the KVM apparatus comprising:
    a KVM switch with an output port and an input port; and
    an impedance element with a first end and a second end, where the first end is electrically coupled to the output port and the second end is electrically coupled to the input port and configured to couple to a conductor, wherein:
    the conductor has a first end and a second end;
    the KVM switch is configured to generate an electrical signal at the first end of the conductor such that the electrical signal propagates along the conductor from the first end to the second end and back to the first end;
    the KVM switch is further configured to measure a time needed for the electrical signal to travel along the conductor from the first end to the second end and back to the first end, and to estimate a length of the conductor based on the time; and
    the impedance element has a resistance such that a voltage of the electrical signal is maintain within a predetermined voltage range when the KVM switch generates the electrical signal on the conductor.

2. The KVM apparatus of claim 1 wherein:
the impedance element comprises a resistor.

3. The KVM apparatus of claim 1 wherein:
the KVM switch is further configured to detect at the input port a voltage transition at an input threshold voltage; and
the KVM switch is further configured to measure the time by measuring the time between when the KVM switch generates an electrical signal on the conductor and when a voltage on the input port crosses the input threshold voltage.

4. The KVM apparatus of claim 1 wherein:
the KVM switch is configured to measure the time when the second end of the conductor is electrically floating.

5. The KVM apparatus of claim 1 wherein:
the KVM switch is configured to measure the time when the second end of the conductor is electrically coupled to a ground potential.

6. The KVM apparatus of claim 1 wherein:
the KVM switch is further configured to detect at the input port a voltage transition at an input threshold voltage; and
the KVM switch is further configured to generate the electrical signal that varies between an initial voltage less than the input threshold voltage and a final voltage greater than the input threshold voltage.

7. The KVM apparatus of claim 6 wherein:
the KVM switch is configured to generate the electrical signal that further has a first interim voltage when the electrical signal first reaches the second end of the conductor and a second interim voltage when the electrical signal first returns to the first end of the conductor after traveling to the second end of the conductor; and
the resistance of the impedance element is such that the first interim voltage is less than the input threshold voltage and the second interim voltage is equal to or greater than the input threshold voltage.

8. The KVM apparatus of claim 1 further comprising:
a first device configured to communicate with the KVM switch and emulate at least one of a keyboard, a video monitor, and a mouse;
wherein:
the KVM switch is further configured to be electrically coupled to the first device.

9. The KVM apparatus of claim 8 further comprising:
a second device configured to communicate with the KVM switch and emulate at least one of the keyboard, the video monitor, and the mouse;
wherein:
the KVM switch is further configured to be electrically coupled to the second device.

10. The KVM apparatus of claim 1 further comprising:
the impedance element has the resistance that is chosen based on at least one of:
an output impedance of the output port, an impedance of the conductor, and an input threshold voltage of the input port.

11. The KVM apparatus of claim 1 wherein:
the KVM switch is further configured to calculate a compensation factor based on the time.

12. The KVM apparatus of claim 11 further comprising:
a database wherein the time is associated with the compensation factor.

13. The KVM apparatus of claim 12 wherein:
the database contains at least two compensation times, the at least two compensation times comprise the time; and
the database further contains at least two compensation factors, the at least two compensation factors comprise the compensation factor.

14. A KVM system comprising:
a KVM switch;
a first device configured to communicate with the KVM switch and emulate at least one of a keyboard, a video monitor, and a mouse;
an impedance element electrically coupled to the first device, wherein:
a first wire has a first end and a second end;
the KVM switch is configured to couple to the first end of the first wire;
the first device is configured to couple to the second end of the first wire;
when the first device is coupled to the second end of the first wire, the first device is configured to place an electrical signal on the first wire at the second end such that the electrical signal travels along the first wire from the second end to the first end and back to the second end, thereby creating a first signal transition at the second end; and
the first device is further configured to measure the passage of a first time between the placing of the electrical signal on the first wire and the first signal transition, and to estimate a length of the conductor based on the first time.

15. The system of claim 14 wherein:
the first device comprises an input port and an output port;
the impedance element has a first end and a second end;
the first end of the impedance element is electrically coupled to the output port and the second end of the impedance element is electrically coupled to the input port and capable of being coupled to the second end of the first wire.

16. The system of claim 14 wherein:
the impedance element comprises a resistor.

17. The system of claim 14 further comprising:
a second device configured to communicate with the KVM switch and emulate at least one of the keyboard, the video monitor, and the mouse.

18. The system of claim 17 wherein:
a second wire has a first end and a second end;
the KVM switch is configured to be coupled to the first end of the second wire;
the second device is configured to be coupled to second end of the second wire;
when the second device is coupled to the second end of the second wire, the second device is further configured to place an electrical signal on the second wire at the second end such that the electrical signal travels along the second wire from the second end to the first end and back to the second end, thereby creating a second signal transition at the second end; and
the second device is further configured to measure a second time between the placing of the electrical signal on the second wire and the second signal transition, and to estimate a length of the conductor based on the second time.

19. The system of claim 14 wherein:
the first device is configured to generate the electrical signal with a first interim voltage on the first wire when the electrical signal first reaches the first end of the first wire and with a second interim voltage when the electrical signal first returns to the second end of the first wire after traveling to the first end of the first wire;
the input port has an input threshold voltage;
the impedance element has a resistance;
the resistance of the impedance element is such that the first interim voltage is less than the input threshold voltage and the second interim voltage is equal to or greater than the input threshold voltage; and
the first device is configured to generate the electrical signal in the first wire such that a voltage on the input port when the electrical signal first returns to the first end of the first wire after traveling to the second end of the first wire equals the second interim voltage.

20. The system of claim 14 wherein:
the impedance element has a resistance that is chosen based on at least one of: an output impedance of the output port, an impedance of the conductor, and an input threshold voltage of the input port.

21. The system of claim 14 wherein:
the first device is configured to calculate a compensation factor based on the first time.

22. The system of claim 21 further comprising:
a database wherein the first time is associated with the compensation factor.

23. The system of claim 22 wherein:
the database contains at least two compensation times, the at least two compensation times comprise the first time; and
the database further contains at least two compensation factors, the at least two compensation factors comprise the compensation factor.

24. A KVM system for transmitting keyboard, video, and mouse signals through a conductor, the KVM system comprising:
a KVM switch;
a first device configured to communicate with the KVM switch and be coupled to one of a computer and a peripheral device; and
an impedance element electrically coupled between the KVM switch and the first device, wherein:
the KVM switch and the first device are capable of being electrically coupled by the conductor; and
the KVM switch comprises a first means for estimating the length of the conductor, wherein the KVM switch further comprises an input port and an output port;
the impedance element has a first end and a second end; and
the first end of the impedance element is electrically coupled to the output port of the KVM switch and the second end of the impedance element is electrically coupled to the input port of the KVM switch and capable of being coupled to the conductor.

25. The KVM system of claim 24 wherein:
the impedance element comprises a resistor.

26. The KVM system of claim 24 wherein:
the first device comprises a second means for estimating the length of the conductor.

27. The KVM system of claim 26 wherein:
the first device further comprises an input port and an output port;

the impedance element has a first end and a second end; and the first end of the impedance element is electrically coupled to the output port of the first device and the second end of the impedance element is electrically coupled to the input port of the first device and capable of being coupled to the conductor.

* * * * *